(12) United States Patent
Nagaoka et al.

(10) Patent No.: US 10,361,628 B2
(45) Date of Patent: Jul. 23, 2019

(54) POWER CONVERTER

(71) Applicant: OMRON Corporation, Kyoto-shi, Kyoto (JP)

(72) Inventors: Shingo Nagaoka, Kizugawa (JP); Hiroyuki Onishi, Kyoto (JP); Takeo Nishikawa, Kyoto (JP)

(73) Assignee: OMRON Corporation, Kyoto-shi (JP)

( * ) Notice: Subject to any disclaimer, the term of this patent is extended or adjusted under 35 U.S.C. 154(b) by 0 days.

(21) Appl. No.: 15/784,326

(22) Filed: Oct. 16, 2017

(65) Prior Publication Data
US 2018/0048229 A1 Feb. 15, 2018

Related U.S. Application Data

(63) Continuation of application No. PCT/JP2016/057179, filed on Mar. 8, 2016.

(30) Foreign Application Priority Data

Jun. 30, 2015 (JP) .................................. 2015-131404

(51) Int. Cl.
*H02M 3/155* (2006.01)
*H05K 7/20* (2006.01)
(Continued)

(52) U.S. Cl.
CPC ............ *H02M 3/155* (2013.01); *H01L 23/34* (2013.01); *H02M 1/12* (2013.01); *H02M 1/32* (2013.01);
(Continued)

(58) Field of Classification Search
CPC .. H02M 3/155; H02M 3/33592; H02M 7/003; H02M 7/20; H02M 7/217;
(Continued)

(56) References Cited

U.S. PATENT DOCUMENTS 3,138,752 A * 6/1964 De Blasio ............... G05F 1/573
323/276
3,582,753 A * 6/1971 Lejon ................... G05B 19/048
336/84 R
(Continued)

FOREIGN PATENT DOCUMENTS

JP H9-298889 A 11/1997
JP H11-356047 A 12/1999
(Continued)

OTHER PUBLICATIONS

An English translation of the International Search Report of PCT/JP2016/057179 dated May 24, 2016.
An English translation of the Written Opinion of PCT/JP2016/057179 dated May 24, 2016.
The extended European search report dated May 14, 2018 in a counterpart European Patent application.

*Primary Examiner* — Yemane Mehari
(74) *Attorney, Agent, or Firm* — Metrolex IP Law Group, PLLC (57) ABSTRACT

Provided is a power converter which is applied to a power converter equipped with a switching element provided on a line, and a radiator connected to a predetermined potential such as a ground potential. A noise eliminator in which a conductive member is covered with insulator is provided between the switching element (semiconductor switch) and the radiator (heatsink). A conductive member of the noise eliminator is connected to a stable potential.

10 Claims, 9 Drawing Sheets

(51) Int. Cl.
*H02M 1/32* (2007.01)
*H02M 3/335* (2006.01)
*H02M 5/293* (2006.01)
*H02M 7/00* (2006.01)
*H02M 7/217* (2006.01)
*H01L 23/34* (2006.01)
*H02M 1/12* (2006.01)
*H02M 1/42* (2007.01)
*H02M 1/00* (2006.01)
*H02M 7/483* (2007.01)

(52) U.S. Cl.
CPC ....... *H02M 3/33592* (2013.01); *H02M 5/293* (2013.01); *H02M 7/003* (2013.01); *H02M 7/217* (2013.01); *H05K 7/20* (2013.01); *H02M 1/4258* (2013.01); *H02M 2001/0006* (2013.01); *H02M 2001/123* (2013.01); *H02M 2007/4835* (2013.01)

(58) Field of Classification Search
CPC ........... H02M 2007/4835; H02M 1/32; H02M 1/4285; H02M 2001/0006; H02M 5/293
USPC .................................................. 323/271–285
See application file for complete search history.

(56) References Cited

U.S. PATENT DOCUMENTS

| | | | | |
|---|---|---|---|---|
| 5,171,948 | A * | 12/1992 | Ishii | H05B 6/683 |
| | | | | 219/717 |
| 6,980,074 | B1 * | 12/2005 | Jitaru | H01F 27/2804 |
| | | | | 336/200 |
| 7,393,432 | B2 * | 7/2008 | Dhindsa | H01J 37/32091 |
| | | | | 118/723 E |
| 9,660,518 | B2 * | 5/2017 | Nomura | H02M 1/36 |
| 2004/0164405 | A1 | 8/2004 | Umezu et al. | |
| 2006/0279975 | A1 * | 12/2006 | Choi | H02M 1/32 |
| | | | | 363/141 |
| 2008/0144341 | A1 * | 6/2008 | Cook | H02M 1/32 |
| | | | | 363/53 |
| 2016/0123833 | A1 * | 5/2016 | Schwartz | G01M 3/18 |
| | | | | 137/487.5 |
| 2018/0042104 | A1 * | 2/2018 | Nagaoka | H02M 1/44 |

FOREIGN PATENT DOCUMENTS

| | | |
|---|---|---|
| JP | 2001-69764 A | 3/2001 |
| JP | 2009-299928 A | 12/2009 |
| JP | 2011-82535 A | 4/2011 |
| WO | 2011/053981 A2 | 5/2011 |

* cited by examiner

POWER CONVERTER

CROSS REFERENCE TO RELATED APPLICATIONS

This application is a continuation application of International Application No. PCT/JP2016/057179, filed on Mar. 8, 2016, which claims priority based on the Article 8 of Patent Cooperation Treaty from prior Japanese Patent Application No. 2015-131404, filed on Jun. 30, 2015, the entire contents of which are incorporated herein by reference.

TECHNICAL FIELD

The disclosure relates to a power converter equipped with: a switching element provided on a line connecting an input side and an output side to each other; and a radiator connected to a predetermined potential.

BACKGROUND ART

A power converter is used in various applications, in which a semiconductor switch is switched to control an output voltage and/or an output current. To the power converter is attached a heatsink to radiate heat generated by the semiconductor switch.

Figure 1:
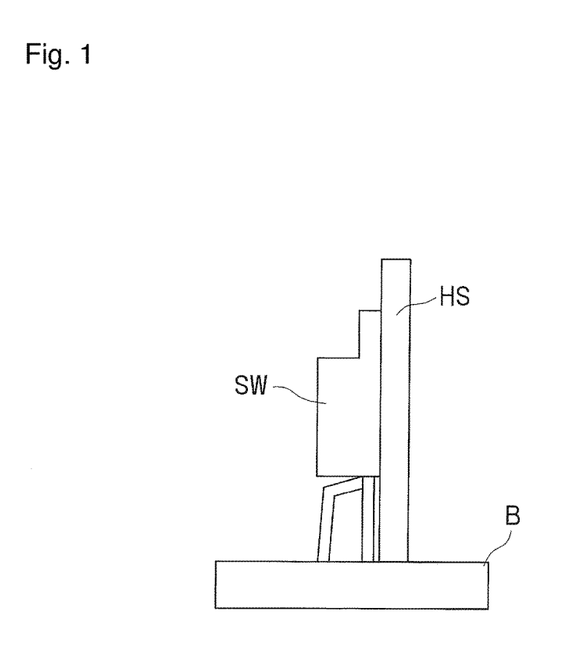
FIG. 1 is a schematic side view schematically illustrating an outer appearance of a semiconductor switch equipped on a power converter and an attached heatsink.

FIG. 1 is a schematic side view schematically showing a semiconductor switch equipped on a power converter and an outer appearance of an attached heatsink. FIG. 1 shows a semiconductor switch SW equipped on the power converter. The semiconductor switch SW is attached with a heatsink HS and is fixed on a circuit board B. The heatsink HS has a function of cooling by externally radiating heat generated on the semiconductor switch SW.

However; when the heatsink HS is connected to an FG (frame ground), a parasitic capacitance is generated between the semiconductor switch SW and the heatsink HS.

Figure 2:
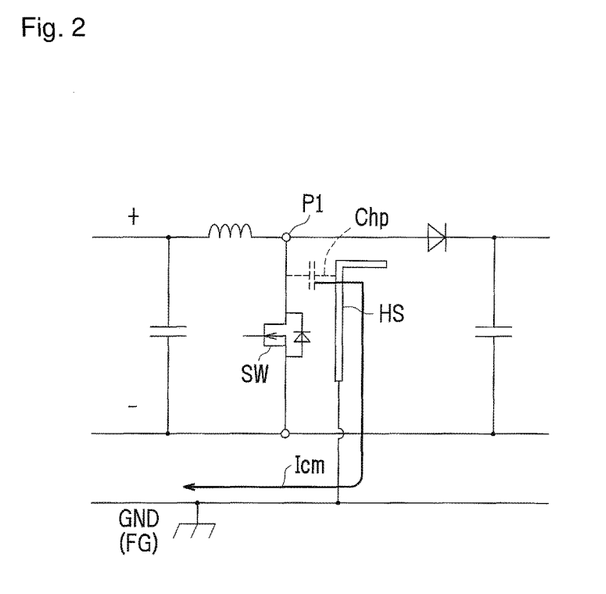
FIG. 2 is an explanatory diagram schematically illustrating a heatsink on a circuit diagram related to a semiconductor switch equipped on a power converter.

FIG. 2 is an explanatory diagram schematically depicting the heatsink in a circuit diagram related to the semiconductor switch equipped on a power converter. FIG. 2 shows a circuit related to a power converter in which the semiconductor switch SW is provided to short-circuit between a pair of lines connecting an input side and an output side, and the heatsink HS is shown on the right side of the semiconductor switch SW. The heatsink HS is connected to the FG. Further, a parasitic capacitance Chp is generated between the semiconductor switch SW and the heatsink HS. The generated parasitic capacitance Chp transfers to the FG a voltage fluctuation at a point P1 connected to the positive terminal of the semiconductor switch SW, and whereby a common mode current Icm flows as noise.

Figure 3:
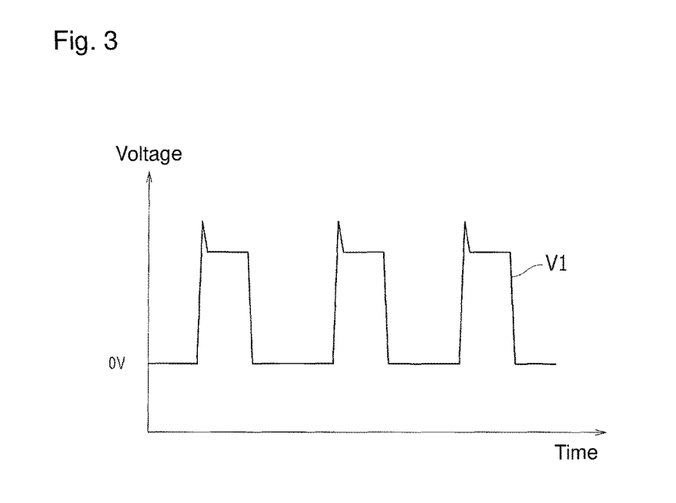
FIG. 3 is a graph illustrating a voltage change at a point P1 in a power converter.

FIG. 3 is a graph showing a voltage change at the point P1 of the power converter. FIG. 3 shows a temporal change of a voltage V1 at the point P1, where the horizontal axis represents time and the vertical axis represents the voltage at the point P1. Because the temporal change of the voltage V1 at the point P1 shown in FIG. 3 is transferred to the FG through the parasitic capacitance Chp, the temporal change of the voltage V1 is output as noise to the input side of the power converter.

As described above, when the heatsink HS is connected to the FG, large noise depending on the voltage fluctuation at the point P1 is output to the input side of the power converter. The magnitude of the common mode current Icm to be transferred to the FG and to become noise is represented by the following Equation (A).

$$Icm = Chp \times dV/dt \qquad \text{Equation (A)}$$

where

Icm is a common mode current,

Chp is a parasitic capacitance between the semiconductor switch SW and the heatsink HS, V is a voltage V1 at the point P1, and t is time.

The parasitic capacitance Chp is represented by the following Equation (B).

$$Chp = \varepsilon \cdot S/dhp \qquad \text{Equation (B)}$$

where $\varepsilon$ is a permittivity between the semiconductor switch SW and the heatsink HS, dhp is a distance between the semiconductor switch SW and the heatsink HS, and S is an area of the electrode.

In view of the above, in order to reduce the above-mentioned noise, Patent Document 1 proposes a method in which a low-permittivity insulation material using ceramics is provided between the semiconductor switch and the heatsink to reduce the parasitic capacitance generated between the semiconductor switch and the heatsink. Because the parasitic capacitance is reduced, the parasitic capacitance Chp in the above Equation (A) is accordingly reduced, and whereby the common mode current Icm can be smaller.

Further, as another method for reducing the noise, Patent Document 2 proposes a method in which the heatsink itself is connected to a stable potential so that the current causing the noise will be enclosed in a circuit.

PRIOR ART DOCUMENTS

Patent Documents

Patent Document 1: Japanese Unexamined Patent Publication No. H9-298889

Patent Document 2: Japanese Unexamined Patent Publication No. H11-356047

SUMMARY OF THE INVENTION

Problems to be Solved by the Invention

However, the method proposed in Patent Document 1 has a problem that the semiconductor switch cannot be sufficiently cooled because of a thermal resistance of the insulation material provided between the semiconductor switch and the heatsink. In addition, there is caused another problem that the ceramics used as the insulation material is expensive so that a cost of the power converter becomes higher.

Further, in the method proposed in Patent Document 2, when the heatsink is used while being fixed to a casing, it is necessary to provide an insulation distance between a ground potential and the stable potential because the casing is at the ground potential. Therefore, there is caused a problem that a larger space needs to be provided for the heatsink to be disposed in, and this problem leads to another problem such as restriction of arrangement of other elements. Further, the bolt for fixing the heatsink must be made of insulation material. If resin material is used as an insulation material bolt, the strength is not enough, and if ceramics is used, the cost of the power converter becomes higher. On the other hand, if the heatsink is not fixed on the casing, the heatsink needs to be fixed at many positions to ensure fixing strength, and there is a problem such as restriction of arrangement of other elements.

One or more aspects have been made in view of the above circumstances, and a conductive member is provided between a switching element and a heatsink, an insulator is provided between the conductive member and the switching element and between the conductive member and a radiator, and the conductive member is connected to a line connecting an input side and an output side. One or more aspects may provide a power converter which can reduce noise by using the above arrangement without causing the problems described with respect to Patent Document 1 and Patent Document 2.

Means for Solving the Problem

In order to solve the above problems, a power converter according to one or more aspects includes: a switching element provided to short-circuit between a pair of lines connecting an input side and an output side to each other; a radiator connected to a predetermined potential; a conductive member provided between the switching element and the radiator; and an insulator provided between the conductive member and the switching element and between the conductive member and the radiator. The conductive member is electrically connected to one line of the pair of lines.

Further, a power converter includes: a switching element provided to short-circuit between a pair of lines connecting an input side and an output side to each other; a radiator connected to a predetermined potential; a conductive member provided between the switching element and the radiator; and an insulator provided to cover the conductive member. The conductive member is electrically connected to one line of the pair of lines.

Further, in a power converter, each of the conductive member and the insulator has a thin-film shape. A surface, of the insulator, facing the switching element is stuck to the switching element, and a surface, of the insulator, facing the radiator is stuck to the radiator.

Further, in a power converter, the one line to which the conductive member is connected is connected to a stable potential.

Further, in a power converter, the predetermined potential to which the radiator is connected is a ground potential.

A power converter according to one or more aspects can enclose in a circuit the noise caused by a parasitic capacitance.

Effect of the Invention

In one or more aspects, a conductive member is provided between the switching element and the heatsink, an insulator is provided between the conductive member and the switching element and between the conductive member and the radiator, and the conductive member is connected to the line. This arrangement enables a noise current to flow to the line side, the noise current being based on parasitic capacitances generated between the conductive member and the switching element and between the conductive member and the radiator. Therefore, the noise is enclosed in a circuit, and an excellent effect is provided. For example, the noise which is output to the input side of the power converter can be reduced.

MODE FOR CARRYING OUT THE INVENTION

Hereinafter, embodiments will be described with reference to the drawings. Note that the following embodiments are examples in which the present invention is embodied, and the embodiments are not intended to limit the technical scope of the present invention.

Figure 4:
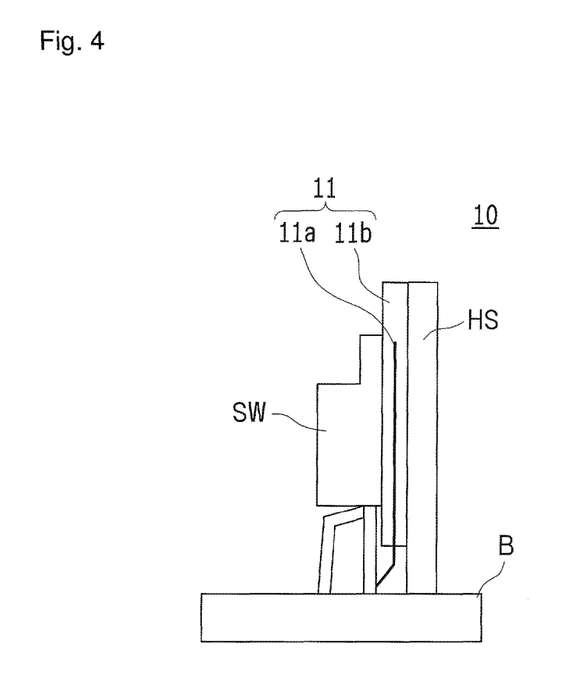
FIG. 4 is a schematic side view schematically illustrating an example of an outer appearance of a power converter according to one or more embodiments.

FIG. 4 is a schematic side view schematically showing an example of an outer appearance of a power converter according to one or more embodiments. A power converter 10 according to one or more embodiments is a device such as an inverter or a DC/DC converter in which a semiconductor switch SW is used to perform control of conversion of an output voltage and/or an output current.

The semiconductor switch SW is configured with a semiconductor switching element such as a MOSFET (Metal-Oxide-Semiconductor Field-Effect Transistor) or an IGBT (Insulated Gate Bipolar Transistor). The semiconductor switch SW is fixed on a circuit board B by using a source terminal, a drain terminal, and a gate terminal. Further, on the circuit board B is vertically provided a heatsink (radiator) HS which has a function of cooling by externally radiating heat generated on the semiconductor switch SW. The heatsink HS is electrically connected to an FG (frame ground) to be described later. Further, on the circuit board B, a noise eliminator 11 is provided between the semiconductor switch SW and the heatsink HS, and the noise eliminator 11 reduces a noise current flowing, from a parasitic capacitance generated between the semiconductor switch SW and the heatsink HS, to the input side of the power converter 10.

The noise eliminator 11 is equipped with: a conductive member 11a having a thin-film shape such as a copper foil; and an insulator 11b covering the conductive member 11a. The conductive member 11a is electrically connected to a second line 12b (see FIG. 5), to be described later, through the source terminal of the semiconductor switch SW. The noise eliminator 11 has a thin-film shape in which the thin-film shaped conductive member 11a is covered with the thin-film shaped insulator (insulating film) 11b, and one surface of the insulator 11b on the side facing the semiconductor switch SW is stuck to the semiconductor switch SW, and the other surface on the side facing the heatsink HS is stuck to the heatsink HS. Specifically, the conductive member 11a is disposed between the semiconductor switch SW and the heatsink HS, and the insulator 11b is disposed, as an insulating film, between the conductive member 11a and the semiconductor switch SW and between the conductive member 11a and the heatsink HS. Further, in order to increase an efficiency of heat transfer at which the heat generated on the semiconductor switch SW is transferred to the heatsink HS through the noise eliminator 11, the semiconductor switch SW has a heat radiation surface to be stuck to one surface of the noise eliminator 11, and the heatsink HS has a heat absorption surface to be stuck to the other surface of the noise eliminator 11.

Figure 5:
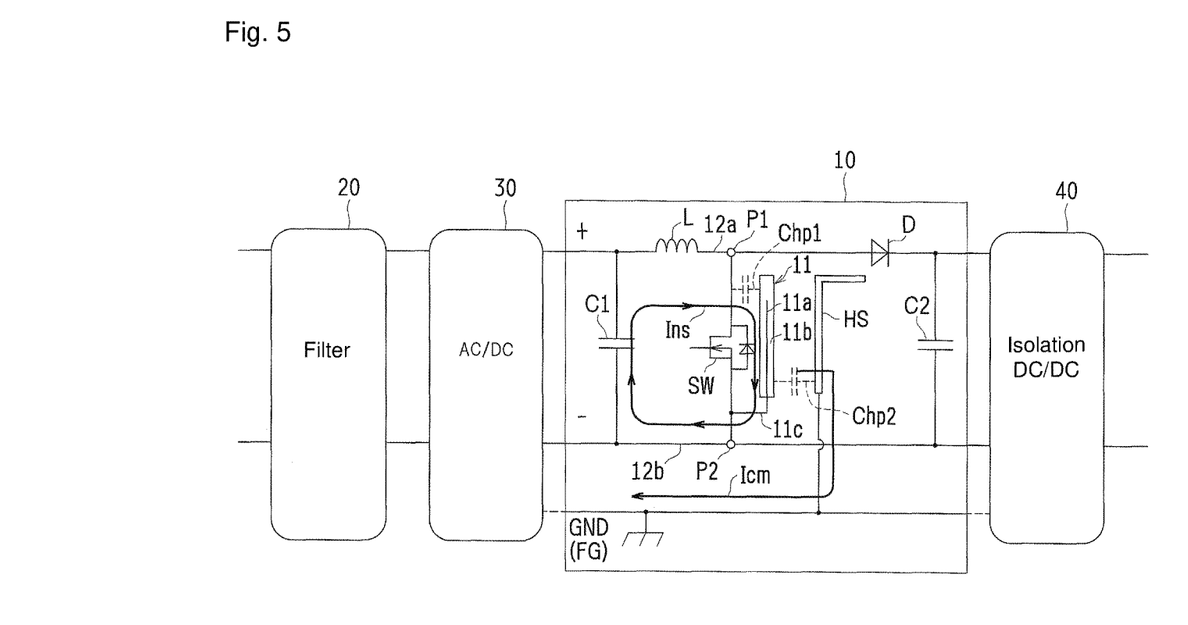
FIG. 5 is an explanatory diagram schematically illustrating an example of a control system using a heatsink and a noise eliminator in a circuit diagram related to a power converter according to one or more embodiments.

FIG. 5 is an explanatory diagram schematically depicting an example of a control system using a heatsink HS and a noise eliminator 11 in a circuit diagram related to the power converter 10 according to one or more embodiments. In the control system exemplified in FIG. 5, there are used a filter 20 connected to an AC power source (not shown), an AC/DC converter 30 such as a diode bridge which converts alternate current supplied from the AC power source to the DC current, the power converter 10 which performs power conversion such as smoothing and boosting of a voltage, and an isolation DC/DC converter 40 such as a transformer which performs conversion to a voltage and a current of a specification depending on a power load (not shown). The DC current converted from alternate current by the AC/DC converter 30 has a pulsating current in which the minus voltage of the alternate current output from the filter 20 side is reversed, and the DC current converted from alternate current has the same polarity but changes in the magnitude. Then, the power converter 10 smooths the DC voltage supplied as a pulsating current.

The power converter 10 is provided with a first line 12a and a second line 12b each connecting an input side connected to the AC/DC converter 30 and an output side connected to the isolation DC/DC converter 40. The first line 12a and the second line 12b are connected to a first potential and a second potential on the input side. The first line 12a is connected to, for example, the plus side as the first potential. The second line 12b is connected to, for example, the minus side as the second potential and is used as a line connected to the stable potential lower than the first potential.

In the power converter 10, a first capacitor C1 is provided, on the input side which receives an input from the AC/DC converter 30, so as to connect between the first line 12a and the second line 12b and to perform smoothing. Further, on the output side on which outputting to the isolation DC/DC converter 40 is performed, there are provided a boost circuit (boost chopper) using a reactor L, the semiconductor switch SW, a rectifier element D, and a second capacitor C2.

The reactor L and the rectifier element D provided as the boost circuit are connected in series on the first line 12a. The rectifier element D is disposed in a direction in which an anode terminal is on the input side and a cathode terminal is on the output side, and the reactor L is connected in series on the anode side. Further, the second capacitor C2 is disposed on the cathode side of the rectifier element D so as to connect between the first line 12a and the second line 12b.

Further, the semiconductor switch SW of the boost circuit is disposed so as to short-circuit between the first line 12a and the second line 12b. For a circuit exemplified in FIG. 5, a MOSFET using a reverse parallel diode is used as the semiconductor switch SW. The drain terminal of the semiconductor switch SW is connected to a first point P1 of the first line 12a which is between the reactor L and the rectifier element D, and the source terminal is connected to a second point P2 of the second line 12b. Note that the second point P2 is located between the connection point at which the first capacitor C1 is connected to the second line 12b and the connection point at which the second capacitor C2 is connected to the second line 12b.

In FIG. 5, the heatsink HS disposed in the vicinity of the semiconductor switch SW is depicted on the right side of the semiconductor switch SW, and the noise eliminator 11 is disposed between the semiconductor switch SW and the heatsink HS. The heatsink HS is connected to the FG (frame ground) at the ground potential. The conductive member 11a of the noise eliminator 11 is connected to the second line 12b through the connecting line 11c.

In addition to the above-described various types of elements, a first parasitic capacitance Chp1 is generated between the conductive member 11a of the noise eliminator 11 and the semiconductor switch SW, and a second parasitic capacitance Chp2 is generated between the conductive member 11a of the noise eliminator 11 and the heatsink HS.

Through the first parasitic capacitance Chp1 generated between the conductive member 11a of the noise eliminator 11 and the semiconductor switch SW, a voltage fluctuation at the first point P1 is transferred from the conductive member 11a to the second line 12b through the second point P2, and a noise current Ins flows. However, the noise current Ins transferred to the second line 12b circulates flowing through the second point P2, the first capacitor C1, the reactor L, and the first point P1 and is enclosed in the circuit configured with these elements; therefore, the noise current Ins is not output as noise to the input side of the power converter 10.

Further, through the second parasitic capacitance Chp2 generated between the conductive member 11a of the noise eliminator 11 and the heatsink HS, a voltage fluctuation at the second point P2 is transferred from the heatsink HS to the FG, and a common mode current Icm flows as noise. In this case, a magnitude of the flowing common mode current Icm can be represented by the following Equation (1).

$$Icm = Chp2 \times dV/dt \qquad \text{Equation (1)}$$

where
Icm is the common mode current,
Chp2 is the parasitic capacitance between the conductive member 11a and the heatsink HS,
V is the voltage V2 at the second point P2, and
t is time.

Figure 6:
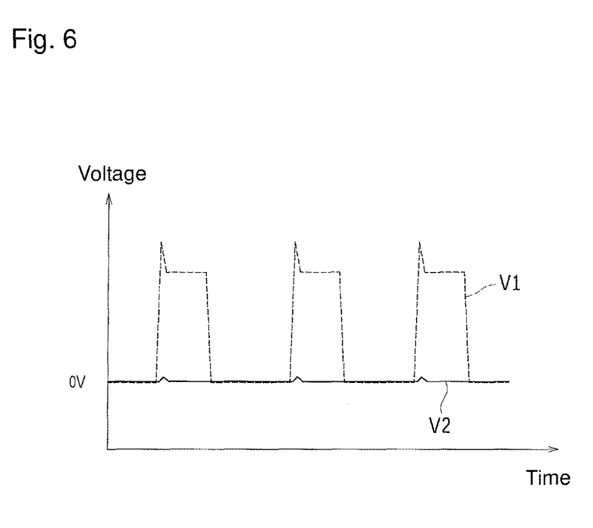
FIG. 6 is a graph illustrating an example of a temporal change in a voltage of a power converter.

The voltage at the second point P2 shown in Equation (1) will be described. FIG. 6 is a graph showing an example of a temporal change in a voltage of the power converter 10. In FIG. 6, the horizontal axis represents time, the vertical axis represents voltage, and the temporal change of the voltage V2 at the second point P2 is represented by a solid line. Further, for the purpose of comparison, the temporal change of the voltage V1 at the first point P1 is represented by a broken line. FIG. 6 shows that the temporal change of the voltage V2 at the second point P2 is smaller than the temporal change of the voltage V1 at the first point P1. Therefore, because the value of dV/dt in Equation (1) caused by the temporal change at the second point P2 is smaller than the value caused by the temporal change at the first point P1, the common mode current Icm is smaller. That is, in the case that there is almost no change at the second point P2 connected to the stable potential as exemplified in FIG. 6, even if the common mode current Icm is output as noise to the input side of the power converter 10, the common mode current Icm is negligibly small.

As described above, in the power converter 10 described in the present application, the noise eliminator 11 in which the conductive member 11a is covered with the insulator 11b is disposed between the semiconductor switch SW and the heatsink HS, and the conductive member 11a is connected to a line. With this arrangement, it is possible to enclose in the power converter 10 the noise current Ins due to the first parasitic capacitance Chp1 generated between the conductive member 11a of the noise eliminator 11 and the semiconductor switch SW. Further, when the conductive member 11a is connected to the second line 12b as the stable potential, it is possible to reduce the common mode current Icm due to the second parasitic capacitance Chp2 generated between the conductive member 11a of the noise eliminator 11 and the heatsink HS. In addition, even when the conductive member 11a and the insulator 11b constituting the noise eliminator 11 is made thin, noise can be reduced; therefore, there are advantages, for example, that temperature rise can be reduced and that production cost can be reduced. Further, because the heatsink HS can be connected without any problem to the FG so that the heatsink HS is at the same potential as the power converter 10, there are advantages that the distance can be arbitrarily selected without being limited by a standard with respect to an insulation distance, that the components can be highly freely arranged, and that downsizing is possible.

Experimental Example

Figure 7:
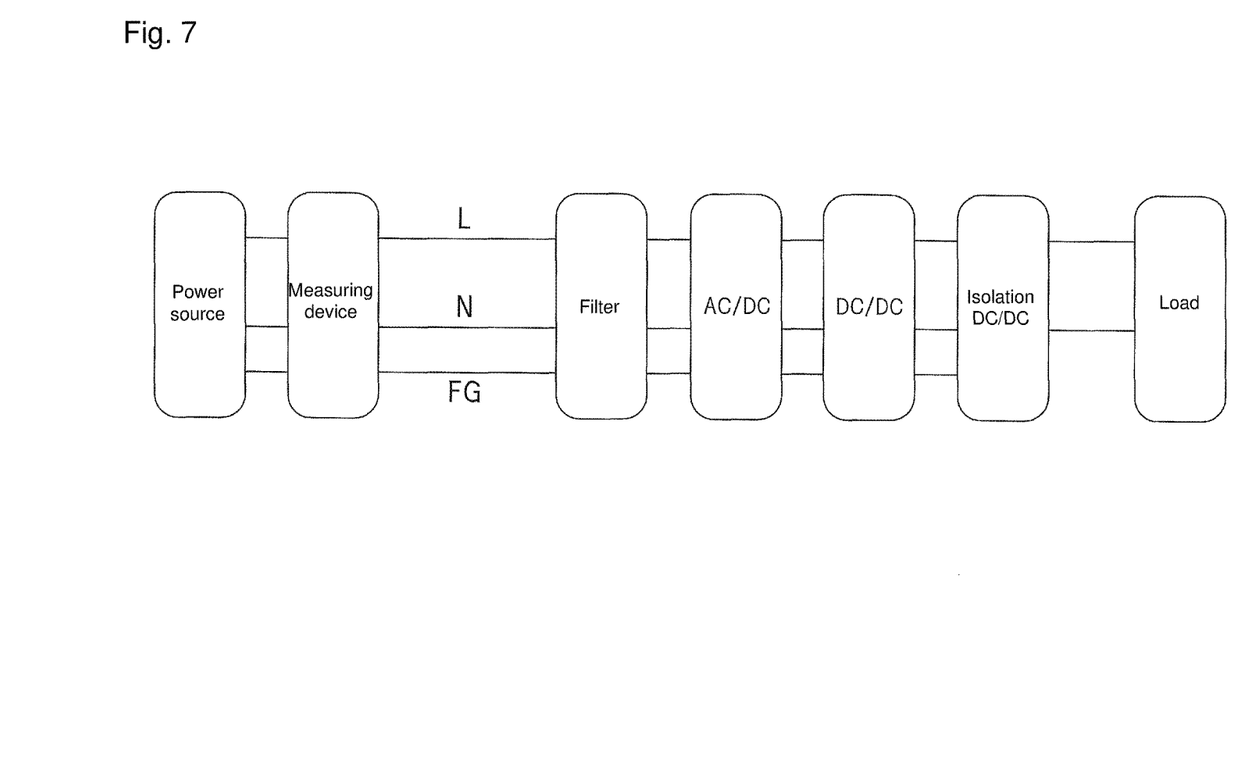
FIG. 7 is a schematic diagram schematically illustrating a device used in an experiment.

Next, an experimental example of a power converter 10 according to one or more embodiments is shown, and the result of the experiment is described. FIG. 7 is a schematic diagram schematically showing a device used in the experiment. The device used in the experiment is equipped with a filter, an AC/DC converter (AC/DC), a power converter (DC/DC), and an isolation DC/DC converter (isolation DC/DC). The filter side, which is the input side, is connected to an AC power source (power source), and the output side, which is the isolation DC/DC converter side, is connected to a power load (load) side. In addition, a noise measuring device (measuring device) is provided between the AC100V power source and the filter, and the noise measuring device measures the noise leaking from the filter side. Further, each circuit and device from the AC100V power source to the isolation DC/DC converters is disposed in series on the lines each of which is connected to each of Live (L), Neutral (N) and Ground (FG). Further, regarding power converters, there were prepared a conventional power converter for comparison and a power converter according to one or more embodiments.

Figure 8A:
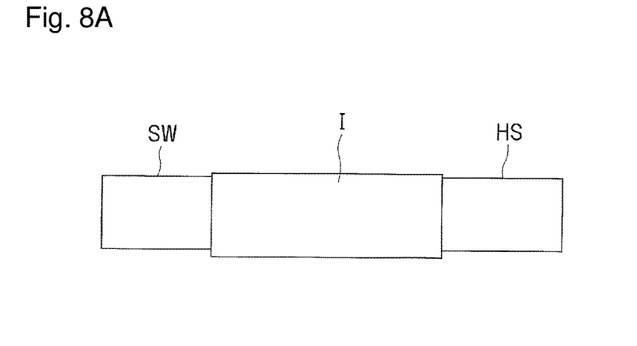
FIG. 8A is an explanatory diagram schematically illustrating a part of a power converter used in an experiment.
Figure 8B:
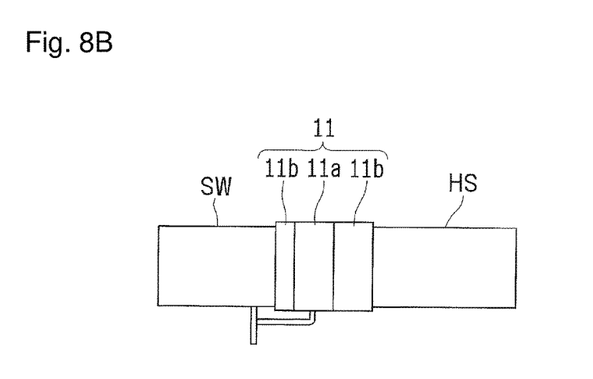
FIG. 8B is an explanatory diagram schematically illustrating a part of a power converter used in an experiment.

FIG. 8A and FIG. 8B are explanatory diagrams each schematically showing a part of each power converter used in the experiment. FIG. 8A corresponds to the conventional power converter for comparison, and FIG. 8B corresponds to the power converter according to one or more embodiments. In the conventional power converter for comparison shown in FIG. 8A, an insulator I is provided between the semiconductor switch SW using a MOSFET and the heatsink HS. The insulator I is made of heat-conductive resin and is formed in a thin-film shape having a thickness of 0.85 mm. The power converter shown in FIG. 8B has a noise eliminator 11 provided between the semiconductor switch SW using a MOSFET and the heatsink HS. Regarding the noise eliminator 11, a copper foil formed in a thin-film shape having a thickness of 18 μm is use as the conductive member 11a, an insulating seat having a thickness of 0.1 mm is provided on the semiconductor switch SW side as the insulator 11b, and a heat-conductive resin having a thickness of 0.3 mm is provided on the heatsink HS side as the insulator 11b. Further, the copper foil used as the conductive member 11a is connected to the source terminal of the semiconductor switch SW.

Figure 9A:
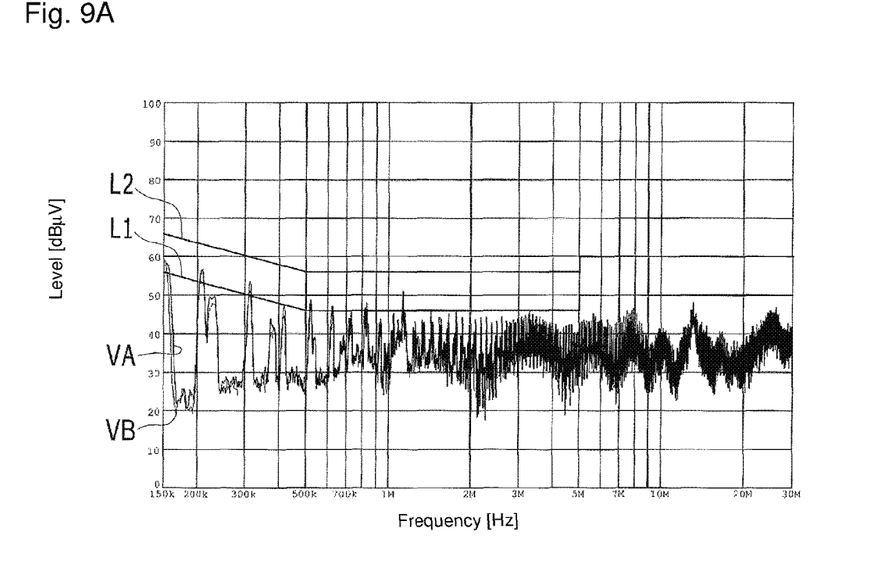
FIG. 9A is a graph illustrating an experimental result.
Figure 9B:
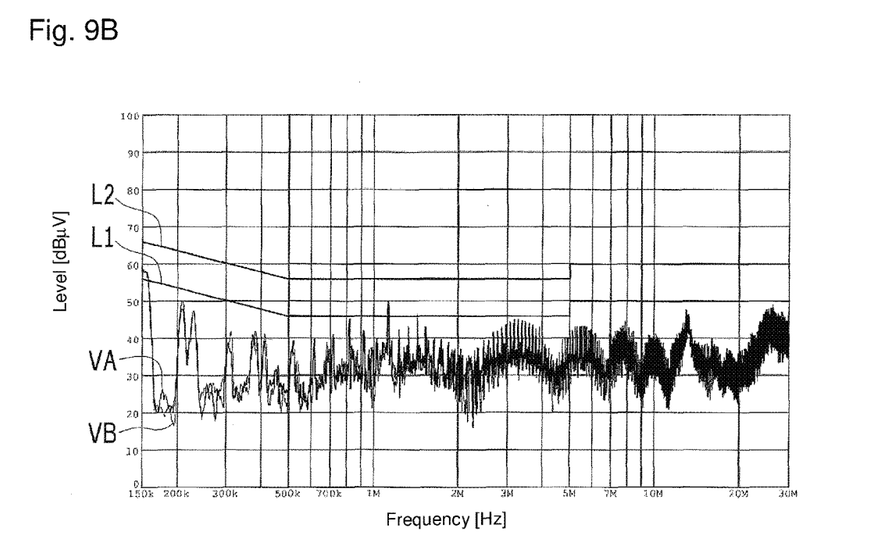
FIG. 9B is a graph illustrating an experimental result.

FIG. 9A and FIG. 9B are graphs each showing the experimental result. FIG. 9A shows the result of the experiment conducted by using the conventional power converter for comparison, and FIG. 9B shows the result of the experiment conducted by using the power converter according to one or more embodiments. In each of FIG. 9A and FIG. 9B, frequency [Hz] is represented by the horizontal axis, and the noise level [dBμV] is represented by the vertical axis, where the relationship between the frequency and the noise is shown. Note that, in each of FIG. 9A and FIG. 9B, the line L1 represents the average value of class B defined as a standard for noise measurement defined in CISPR Pub. 11 (International Special Committee on Radio Interference; Information technology device), and the line L2 represents the QP (Quasi-Peak detection) defined in CISPR Pub. 11. In addition, in each of FIG. 9A and FIG. 9B, the line VA represents the noise measurement result between L and FG, and the line VB represents the noise measurement result between N and FG.

The comparison between FIG. 9A and FIG. 9B shows that the noise is reduced by using the power converter according to one or more embodiments, that the effect is particularly remarkable in the frequency range of 200 kHz to 1 MHz, and that the reduction rate is conformed to be −10 dB at 300 kHz.

The present invention is not limited to the above-described embodiments and can be carried out in various forms. Therefore, the above-mentioned embodiments are just an example at any points and should not be restrictively interpreted. The scope of the present invention is defined by the accompanying claims and is not limited to the main body of the specification at all. Further, deformations and variations within the scope of the equivalents of the claims are all within the scope of the present invention.

For example, as long as the conductive member 11a is disposed between the semiconductor switch SW and the heatsink HS and the insulator 11b is disposed as an insulating film between the conductive member 11a and the semiconductor switch SW and between the conductive member 11a and the heatsink HS, the conductive member 11a and the insulator 11b can be appropriately designed. For example, the shape does not have to be a thin-film shape. The shape may be a bulk form having some thickness or a hard flat-plate shape, and in order to improve the thermal conductivity, the shape may be formed to have a surface shape such as a curved surface or concavities and convexities, which are different from a flat plane. Further, instead of covering the conductive member 11a with the insulator 11b, the insulator 11b may be stuck as an insulating film on each side of the conductive member 11a. Alternatively, if enough heat radiation effect can be achieved, there is no need for contact among the semiconductor switch SW, the insulator 11b, the conductive member 11a, the insulator 11b, and the heatsink HS. Further, the materials for the conductive member 11a and the insulator 11b can be appropriately selected. However, materials having high thermal conductivity are preferable.

In the form described in the above embodiments, the heatsink HS is connected to the FG; however, the heatsink HS can be designed to be connected to an SG (signal ground) or a ground potential such as a ground instead of the FG, or can be designed to be connected to other potentials which can provide a similar effect. Further, the conductive member 11a of the noise eliminator 11 does not need to be connected to the second line 12b on the source terminal side, either, and can be appropriately designed to be connected to the first line 12a on the drain terminal side, for example. However, in view of reducing the fluctuation of the voltage applied to the first parasitic capacitance Chp1, the conductive member 11a is preferably connected to the second line 12b, which is at a stable potential.

Further, the power converter 10 according to one or more embodiments is not limited to the above-described embodiments and can be applied, to a technical field such as power electronics, as various devices such as a DC-AC inverter and a DC chopper which use a semiconductor switch.

DESCRIPTION OF SYMBOLS 10 power converter
11 noise eliminator
11a conductive member
11b insulator (insulating film)
11c connecting line
12a first line
12b second line
Chp1 first parasitic capacitor
Chp2 second parasitic capacitance
HS heatsink (radiator)
SW semiconductor switch

The invention claimed is:

1. A power converter comprising:
a switching element disposed to short-circuit a pair of lines connecting an input side and an output side to each other;
a radiator disposed in a vicinity of the switching element and electrically connected to a predetermined potential;
a conductive member disposed between the switching element and the radiator; and
an insulator disposed between the conductive member and the switching element and disposed between the conductive member and the radiator,
wherein
the conductive member is electrically connected to one line of the pair of lines, each of the conductive member and the insulator has a thin-film shape, and the insulator comprises:
a first surface disposed between the conductive member and the switching element, the first surface disposed facing the switching element, and the first surface disposed on the switching element; and
a second surface disposed between the conductive member and the radiator, the second surface disposed facing the radiator, and the second surface disposed on the radiator.

2. The power converter according to claim 1, wherein the one line to which the conductive member is connected is connected to a stable potential.

3. The power converter according to claim 2, wherein the predetermined potential to which the radiator is connected is a ground potential.

4. The power converter according to claim 1, wherein the predetermined potential to which the radiator is connected is a ground potential.

5. The power converter according to claim 1, wherein the conductive member is connected to the one line such that a noise current based on a first parasitic capacitance between the conductive member and the switching element is not outputted as noise to the input side and a common mode current based on a second parasitic capacitance generated between the conductive member and the radiator, flows as noise to the input side.

6. A power converter comprising:
a switching element disposed to short-circuit a pair of lines connecting an input side and an output side to each other;
a radiator disposed in a vicinity of the switching element and electrically connected to a predetermined potential;
a conductive member disposed between the switching element and the radiator; and
an insulator disposed so as to cover the conductive member,
wherein the conductive member is electrically connected to one line of the pair of lines,
each of the conductive member and the insulator has a thin-film shape, and the insulator comprises:
a first surface disposed between the conductive member and the switching element, the first surface disposed facing the switching element, and the first surface disposed on the switching element, and
a second surface disposed between the conductive member and the radiator, the second surface disposed facing the radiator, and the second surface disposed on the radiator.

7. The power converter according to claim 6, wherein the one line to which the conductive member is connected is connected to a stable potential.

8. The power converter according to claim 7, wherein the predetermined potential to which the radiator is connected is a ground potential.

9. The power converter according to claim 6, wherein the predetermined potential to which the radiator is connected is a ground potential.

10. The power converter according to claim 6, wherein the conductive member is disposed between the switching element and the radiator such that a noise current based on a first parasitic capacitance between the conductive member and the switching element is not outputted as noise to the input side and a common mode current based on a second parasitic capacitance generated between the conductive member and the radiator, flows as noise to the input side.

* * * * *